United States Patent [19]
Consiglio

[11] Patent Number: 5,854,504
[45] Date of Patent: Dec. 29, 1998

[54] PROCESS TOLERANT NMOS TRANSISTOR FOR ELECTROSTATIC DISCHARGE PROTECTION

[75] Inventor: Rosario J. Consiglio, San Jose, Calif.

[73] Assignee: Maxim Integrated Products, Inc., Sunnyvale, Calif.

[21] Appl. No.: 832,771

[22] Filed: Apr. 1, 1997

[51] Int. Cl.⁶ .............................. H01L 29/76; H01L 23/62
[52] U.S. Cl. ......................... 257/358; 257/360; 257/537
[58] Field of Search .................................. 257/357, 358, 257/359, 360, 537, 538

[56] References Cited

U.S. PATENT DOCUMENTS

| | | | |
|---|---|---|---|
| 4,821,096 | 4/1989 | Maloney | 357/23.13 |
| 5,392,186 | 2/1995 | Alexander et al. | 361/92 |
| 5,438,213 | 8/1995 | Tailliet | 257/360 |
| 5,504,362 | 4/1996 | Pelella et al. | 257/357 |
| 5,508,548 | 4/1996 | Tailliet | 257/360 |
| 5,534,723 | 7/1996 | Iwai et al. | 257/360 |
| 5,561,312 | 10/1996 | Nozoe et al. | 257/357 |

FOREIGN PATENT DOCUMENTS

| | | | |
|---|---|---|---|
| 56-51874 | 5/1981 | Japan | 257/359 |
| 2-271676 | 11/1990 | Japan | 257/357 |
| 3-173468 | 7/1991 | Japan | 257/358 |
| 4-146665 | 5/1992 | Japan | 257/358 |

OTHER PUBLICATIONS

Duvvury, et al., ESD Design Considerations for ULSI, 1985, presented at the EOS/ESD Symposium.
Hu, et al., Hot–Electron–Induced MOSFET Degradation Model, Monitor, and Improvement, Feb. 1985, IEEE Transactions on Electron Devices, vol. ED 32. No. 2.
Gadi Krieger, Thermal Response of Integrated Circuit Input Devices to an Electrostatic Energy Pulse, Apr. 1987, IEEE Transactions on Electron Devices, vol. ED–34, No. 4.

*Primary Examiner*—Donald Monin
*Attorney, Agent, or Firm*—Hickman & Martine, LLP

[57] ABSTRACT

An improved ESD cell provides in the worst case 2,000 volts HBM ESD protection using an NMOS transistor in a lightly-doped drain process. An NMOS transistor has its source connected to ground, and its drain connected through a polysilicon resistor to a pad of an integrated circuit. The pad is also connected by metal to an n+ pocket tap of an n-type epitaxial layer formed on a p-type substrate. The connection of pad metal to the pocket tap forms a second parasitic lateral bipolar junction transistor (BJT) having as a base the p-type well, having an emitter the source of the NMOS transistor, and having as its collector the pocket tap. The parasitic transistor turns on at the right moment and is able to shunt more current around the polysilicon resistor, thus giving a dramatic increase in ESD protection. In a worst case, the ESD cell can pass at a minimum of 2,000 volts, and the expected range of HBM ESD values is between 2,500 volts and 3,000 volts depending upon process variations. Use of a polysilicon resistor allows the device to be driven into avalanche without destroying itself, and enables the parasitic transistor to be turned on. The ESD cell is tolerant of varying processes.

20 Claims, 8 Drawing Sheets

Device I/V Characteristics

Device I/V Characteristics

PROCESS TOLERANT NMOS TRANSISTOR FOR ELECTROSTATIC DISCHARGE PROTECTION

FIELD OF THE INVENTION

The present invention relates generally to semiconductor devices. More specifically, the present invention relates to an electrostatic discharge (ESD) cell for a semiconductor device.

BACKGROUND OF THE INVENTION

Semiconductor devices, whether utilized as part of an integrated circuit or as a discrete component, are often subject to excess energy events such as a static electricity discharge. An excess energy event is a surge of power, often caused by a voltage or a current, which can damage the semiconductor device itself, or can lead to degradation or failure of metal contacts associated with the device. One type of an excess energy event is known as electrostatic discharge (ESD).

It is well known that integrated circuits are susceptible to damage from electrostatic discharges that can inadvertently occur during handling. An integrated circuit is also susceptible to ESD during the manufacturing process, and during its use in electrical circuits. Also, ESD may be present due to handling by humans or by contact with another object that has a built-up static charge.

In order to limit the impacts of ESD, protection devices (sometimes referred to as ESD cells) are inserted between the pad of an integrated circuit and the initial stage of the integrated circuit. One technique used in an ESD cell is to connect a grounded NMOS transistor through a resistor to a pad of the integrated circuit. The transistor thus provides a path for excess current to pass to ground.

With recent advances in Ultra Large Scale Integration technology (ULSI) for producing smaller and smaller devices, the requirements for ESD protection circuits using smaller NMOS transistors are facing new challenges, and various limitations upon miniaturization are appearing. In particular, the use of an NMOS transistor in an ESD cell has been shown to have certain drawbacks in particular process techniques in ULSI. Traditionally, a major factor in the success of the MOSFET (such as an NMOS transistor) has been its compatibility with processes down to very small dimensions. However, there are limits to its miniaturization such as limits imposed by hot electron effects.

Hot electron effects occur when energetic electrons (for n-channel devices) are injected into and trapped within the gate oxide of a transistor, and are seen in ULSI technology. (For p-channel devices, energetic holes can become trapped in the oxide). The hot electron effect degrades and destroys the performance of a transistor. Hot electron effects occur because smaller and smaller devices have correspondingly larger electric fields near the gate oxide. As a result of these larger fields along the channel direction of the MOSFET, a small fraction of the channel carriers have enough energy to enter the insulating gate oxide layer near the drain. In an n-channel MOSFET, energetic electrons entering the oxide create interface traps and oxide wear out, eventually leading to gate-to-drain shorts.

To cope with these problems, so called "Drain Engineering" has been tried. One of the more common solutions is to use the lightly-doped drain (LDD) technique. In this technique, a lightly-doped extension of the drain is inserted between the channel and the drain proper. To increase packing density, this lightly-doped drain extension can be set vertically alongside the gate, rather then directly under the gate in order to control the overall device area. As pointed out in "Hot-Electron-Induced MOSFET Degradation—Model, Monitor, and Improvement", by C. Hu, S. Tam, F. Hsu, P. Ko, T. Chan and K. Terrill, IEEE 1985 (which is hereby incorporated by reference), the use of LDD structures can reduce device degradation due to hot electron effects. Thus, the use of a lightly-doped drain has advantages and can be desirable in ULSI technology.

However, even though an LDD structure for an NMOS transistor is a widely implemented structure in ULSI circuits, there is evidence of adverse effects on ESD performance of an ESD protection circuit that is implemented using an LDD structure. As pointed out in "ESD Design Considerations for ULSI", by C. Duvvury, R. N. Rountree, D. A. Baglee, R. A. McPhee, A. E. Hyslop and L. S. White, presented at the EOS/ESD Symposium, 1985 (which is hereby incorporated by reference), the otherwise attractive and important LDD technology can lead to the degradation of ESD protection. As explained in this paper, the technology drive to use LDD structures is resulting in ESD degradation for the so-called human body model (HBM) stress test. The human body model (HBM) is a voltage stress test for devices as defined in MIL-STD 883B, Method 3015.7.

One common technique for increasing the level of ESD protection while using an NMOS transistor is to move out the drain contact to gate distance. By increasing this distance, a greater level of ESD protection has been achieved as explained in "ESD Design Consideration for ULSI" above. However, this technique has not been successful in combating ESD degradation for LDD structures. In addition, the limit by which the drain contact to gate distance may be increased has a theoretical limit, as explained in "Thermal Response of Integrated Circuit Input Devices to an Electrostatic Energy Pulse" by G. Krieger, IEEE 1987 (which is hereby incorporated by reference). Thus, even if one attempted to increase the drain contact to gate distance for an LDD structure, one would come up against a theoretical limit. Various layouts with longer drain contact to gate distances often produce variable and/or low ESD immunity values.

Thus, for an LDD device (such as an NMOS transistor used for ESD protection), the normal practice of increasing drain contact to gate distance has not worked well. Other techniques such as adding external resistors have been used to increase ESD protection for an LDD device but have also not been completely successful. In particular, for ULSI devices used in high performance analog design, the use of LDD structures for an NMOS transistor has resulted in particularly poor ESD protection. Such an LDD NMOSFET is described in "Reliability and Performance of Submicron LDD NMOSFET's with Buried-As n-Impurity Profiles", by H. Grinolds, M. Kinugawa and M. Kakumu, IEEE 1985 (which is hereby incorporated by reference). One example of such a device has a lightly-doped drain with an Arsenic impurity in the range of $10^{13}$ to $5\times10^{13}$ atoms/cm$^3$ implanted with 80 keV. These devices in particular are not able to pass more than 500 volts human body model (HBM). Generally, devices are required to pass 2,000 volts HBM according to widely accepted industry standards.

Therefore, it would be desirable to have an ESD cell with an NMOS transistor providing both immunity to the hot electron effect and providing increased ESD protection. It would be further desirable to have such an ESD cell that was simple in design and tolerant of manufacturing variations.

SUMMARY OF THE INVENTION

To achieve the foregoing and other objects, and in accordance with the purpose of the present invention, an improved ESD cell is disclosed that provides in the worst case 2,000 volts HBM ESD protection using an NMOS transistor in a lightly-doped drain process.

An embodiment of the ESD cell of the present invention includes an NMOS transistor having its source connected to ground, and its drain connected through a polysilicon resistor to a pad of an integrated circuit. The pad is also connected by metal to an n+ pocket tap of an n-type layer formed on a p-type substrate. The connection of pad metal to the pocket tap forms a second parasitic lateral bipolar junction transistor (BJT) having as a base the p-type well, having an emitter the source of NMOS transistor, and having as its collector the pocket tap. This parasitic transistor turns on at the right moment and is able to shunt more current around the polysilicon resistor, thus giving a dramatic increase in ESD protection.

Additionally, such an ESD cell is tolerant of varying processes and guarantees a minimum of 2,000 volts HBM ESD protection, and the expected range of HBM ESD values is between 2,500 volts and 3,000 volts depending upon process variations. By contrast, a prior art NMOS transistor used for ESD protection in an LDD process could only pass some 250 to 500 volts HBM. The ESD cell of the present invention is tolerant of varying processes because the NMOS device it is not stressed due to the shunting NPN path.

Furthermore, the use of a polysilicon resistor allows the device to be driven into avalanche without destroying itself, and enables the parasitic transistor to be turned on. The leakage for the ESD cell is less than 10 nA at 85 degrees C., and less than 100 nA at 125 degrees C. for a drain voltage of 6 volts. The ESD cell can also withstand a 4,000 volt HBM ESD stress and have less than 1 uA of leakage at ambient temperature.

One advantage of the present invention is the ability to pass more than 2,000 volts human body model (HBM) by connection of pad metal directly to an n-type layer. This connection allows a parasitic lateral bipolar junction transistor to turn on and to shunt current around the device, thus providing superior ESD protection. Normally, concern over latching behavior of the device would preclude a designer from directly connecting pad metal to the epitaxial layer. Unexpectedly, though, the current device does not latch up using this technique, and exhibits excellent characteristics particularly with the use of biCMOS technology.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention relates to an improved electrostatic discharge ESD cell having an NMOS transistor useful for providing superior ESD protection in an integrated circuit formed using an LDD process. The ESD cell of the present invention is also suitable for a variety of process technologies. The present invention is suitable for use with CMOS technology, and works particularly well in bipolar CMOS (biCMOS) technology.

Figure 1:
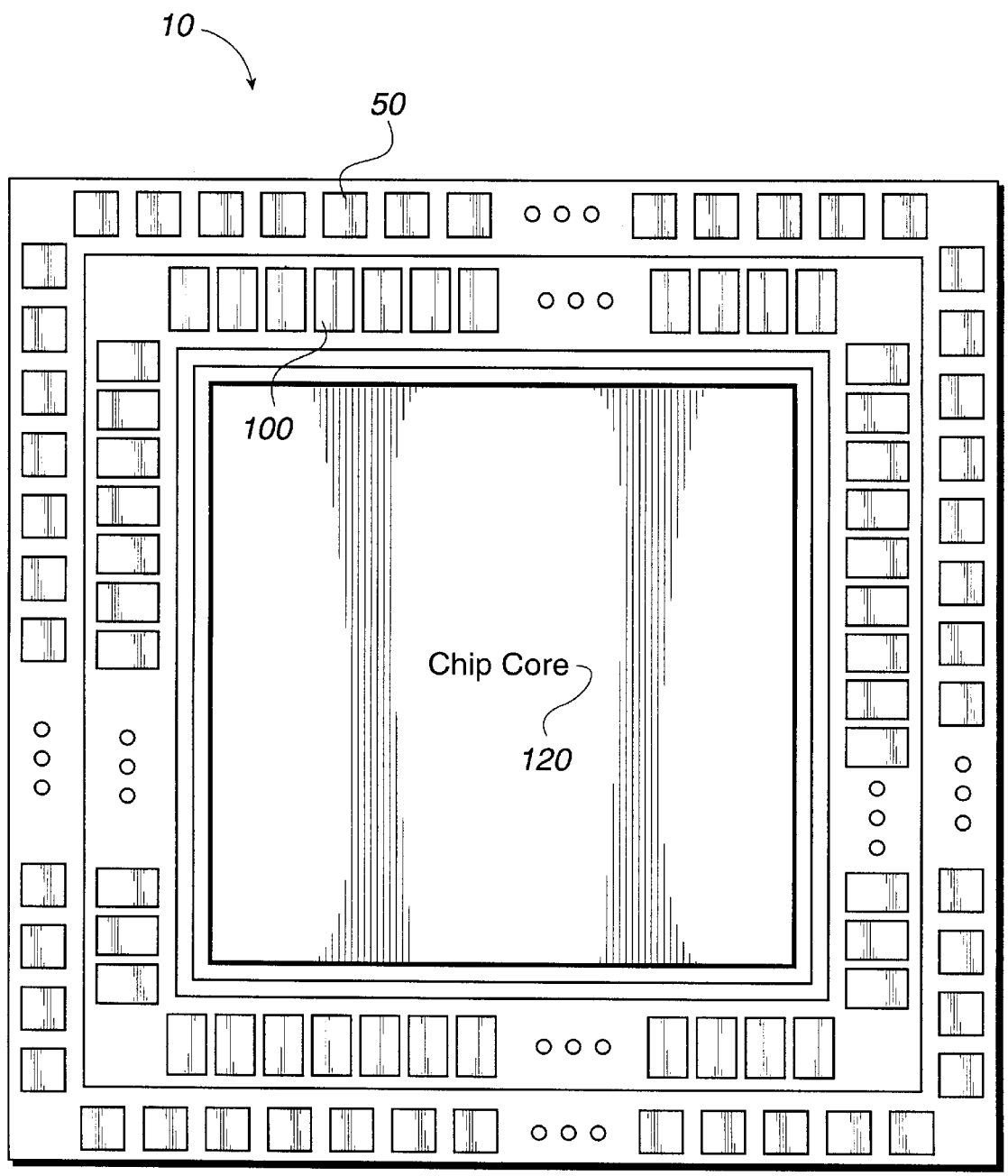
FIG. 1 illustrates an example of an integrated circuit in which an embodiment of the present invention may be used.

In FIG. 1, an integrated circuit 10 of the present invention includes a chip core 120, a number of I/O slots 100 surrounding the chip core, and a corresponding number of pads 50 surrounding the I/O slots. Each pad 50 is connected to an I/O slot 100 for communication with the chip core 120. In one embodiment, the ESD cell of the present invention is located within an I/O slot 100. Preferably, the present invention works particularly well as on-chip protection, however, it is possible that such ESD protection could be provided externally to the integrated circuit. Typically, though, on-chip ESD protection is more cost effective as an integrated circuit manufacturer can optimize protection for his product, rather than having the system manufacturer perform that work.

Figure 2:
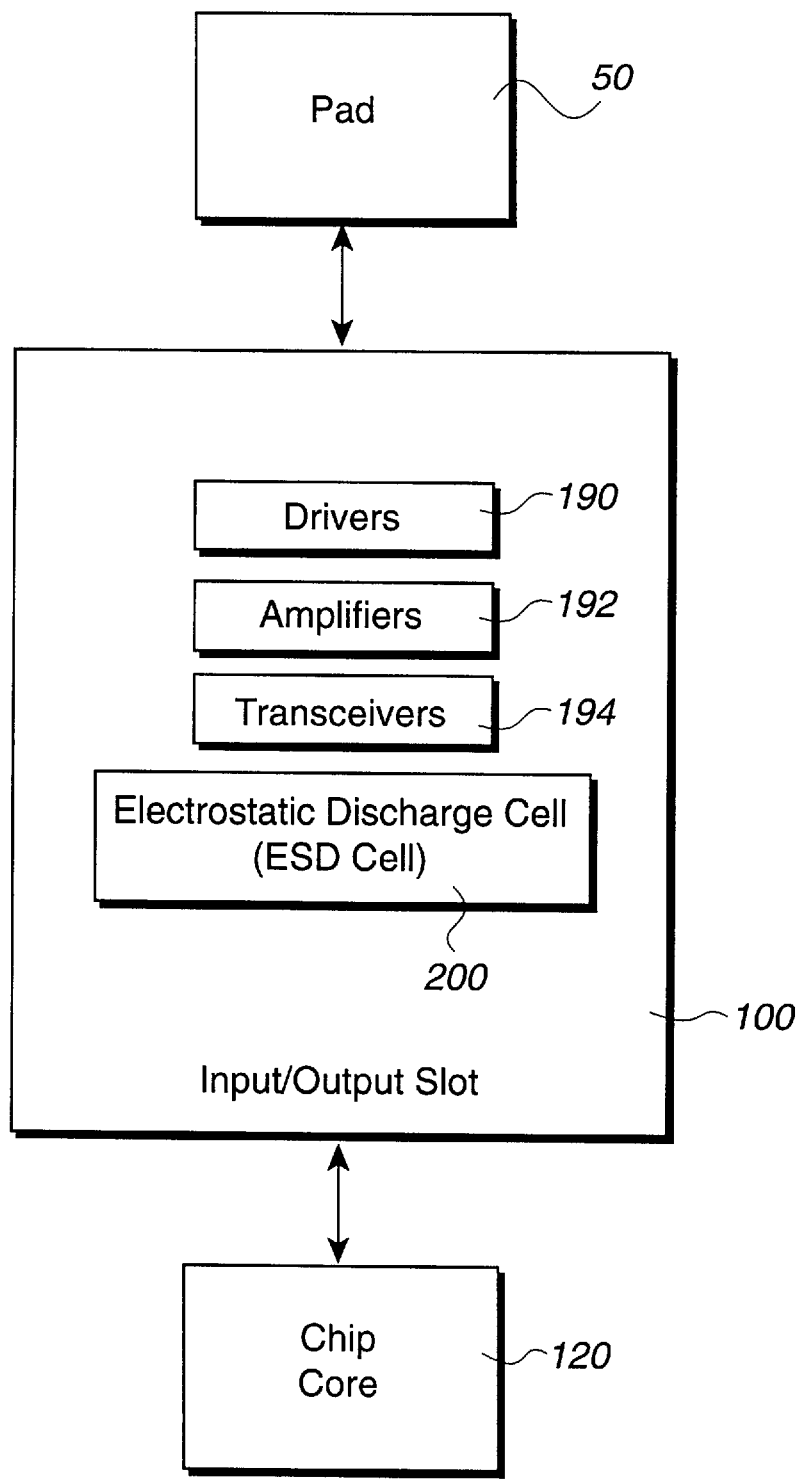
FIG. 2 is a block diagram of an I/O slot of an integrated circuit in which an ESD cell may be present according to one embodiment of the invention.

FIG. 2 illustrates in block diagram form the components of an I/O slot 100 from FIG. 1. I/O slot 100 assists in the communication of electrical signals to and from pad 50 and chip core 120. In an embodiment of the present invention, the ESD cell works well with either an input line or an output line and is located within an I/O slot 100. Typically, also included within an I/O slot are drivers 190, amplifiers 192 and transceivers 194. Other types of ESD protection are also possible within an I/O slot 100.

Figure 3:
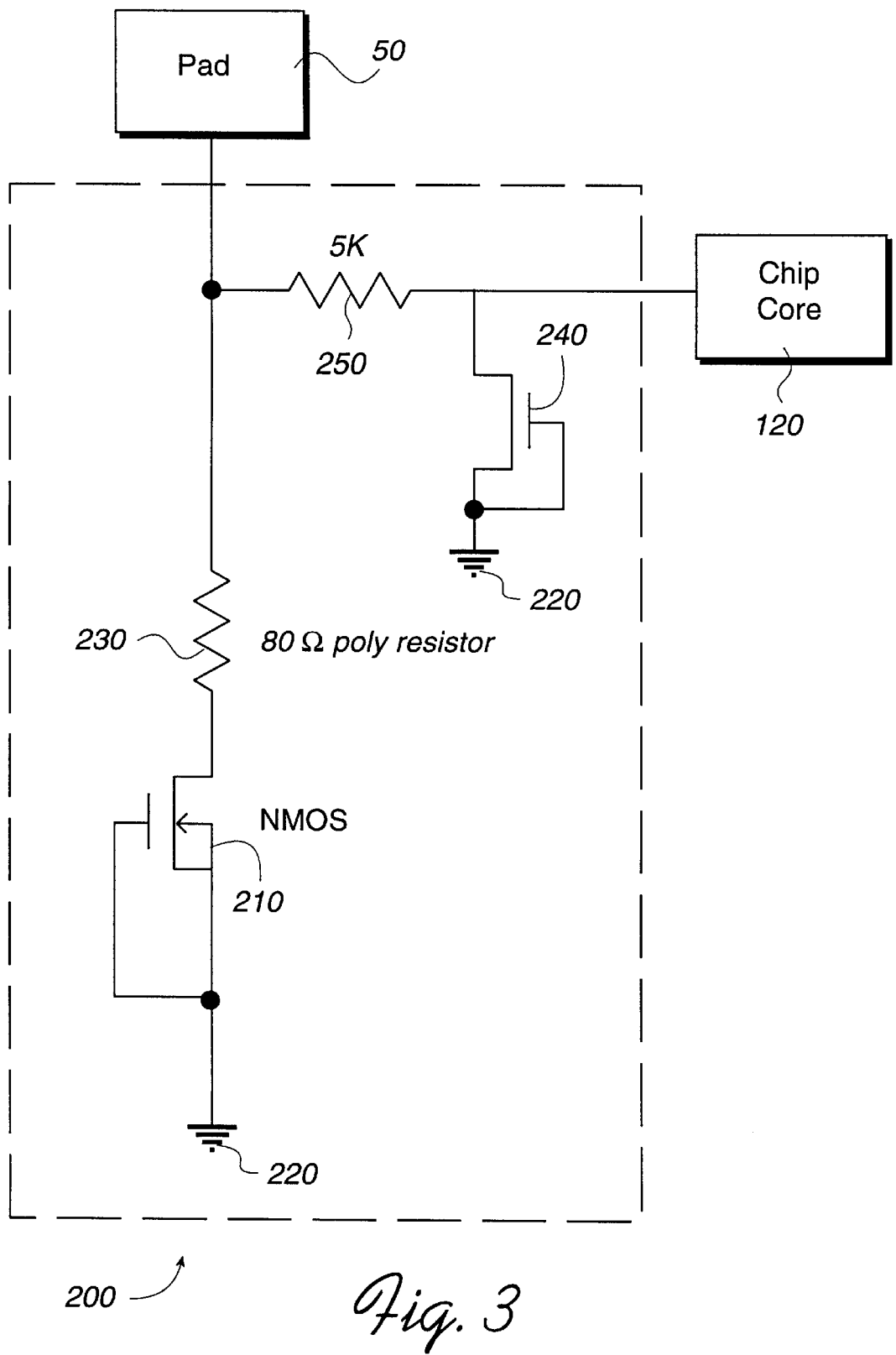
FIG. 3 is a schematic diagram of an ESD cell according to one embodiment of the present invention.

FIG. 3 illustrates in greater detail a first embodiment of ESD cell 200 of FIG. 2. In this embodiment, NMOS transistor 210 connects a pad 50 to ground 220 through a resistor 230. In general, ESD cell 200 operates to pass a large electrostatic discharge from pad 50 through NMOS transistor 210 to ground 220 in order to protect the integrated circuit from the large electrostatic discharge. NMOS 210 has its gate and source both connected to ground, and its drain connected to one end of resistor 230. A particular process cross-section for producing NMOS 210 and resistor 230 will be explained in greater detail below with reference to FIGS. 6 and 7. Preferably, resistor 230 is a polycrystalline silicon (polysilicon) resistor. Resistor 230 works well within a range from 40 Ohms to 80 Ohms, with a value of 79 Ohms working quite well.

Also included within ESD cell 200 is an NMOS buffer transistor 240 and a resistor 250. NMOS 240 is useful for an input pin and helps limit the voltage on pad 50. In one embodiment, NMOS 240 is a device having a design width/length ratio of 50/3, and resistor 250 is a 5k Ohm thin film CrSi resistor.

Figure 4:
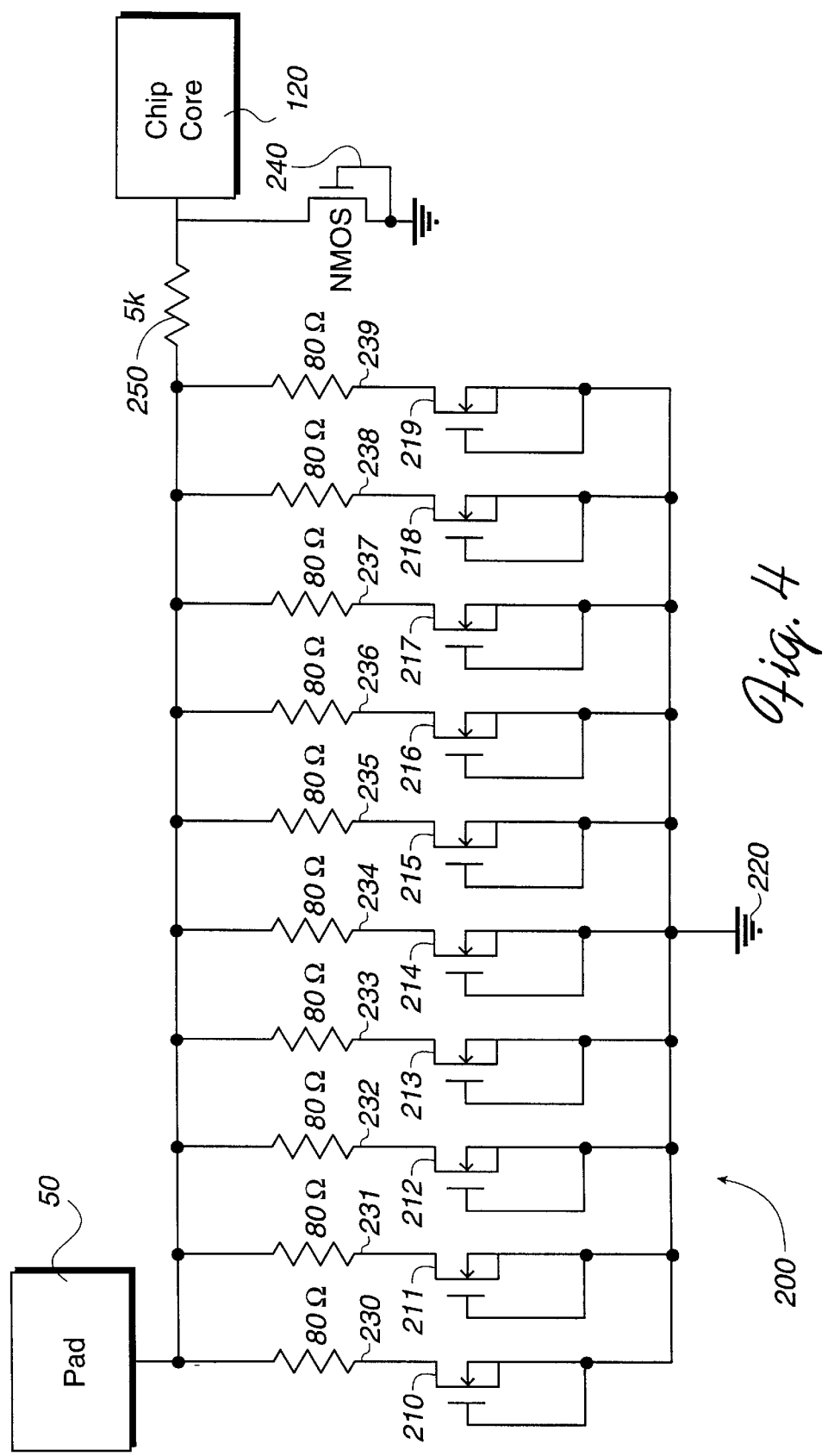
FIG. 4 is a schematic diagram of another embodiment of the present invention in which the ESD cell has ten legs.

Referring next to FIG. 4, an alternate embodiment for an ESD cell 200' is illustrated having ten legs. FIG. 4 shows ten NMOS transistors 210 through 219 each connected in series with a polysilicon resistor 230 to 239, respectfully. Thus, pad 50 is connected to ground 220 through ten such transistor-resistor legs in parallel. In one embodiment, each of the transistors 210 through 219 and the resistors 230 through 239 are similar to NMOS 210 and resistor 230 of FIG. 3, respectively. The use of ten legs provides superior results in worst case measurements.

Figure 5:
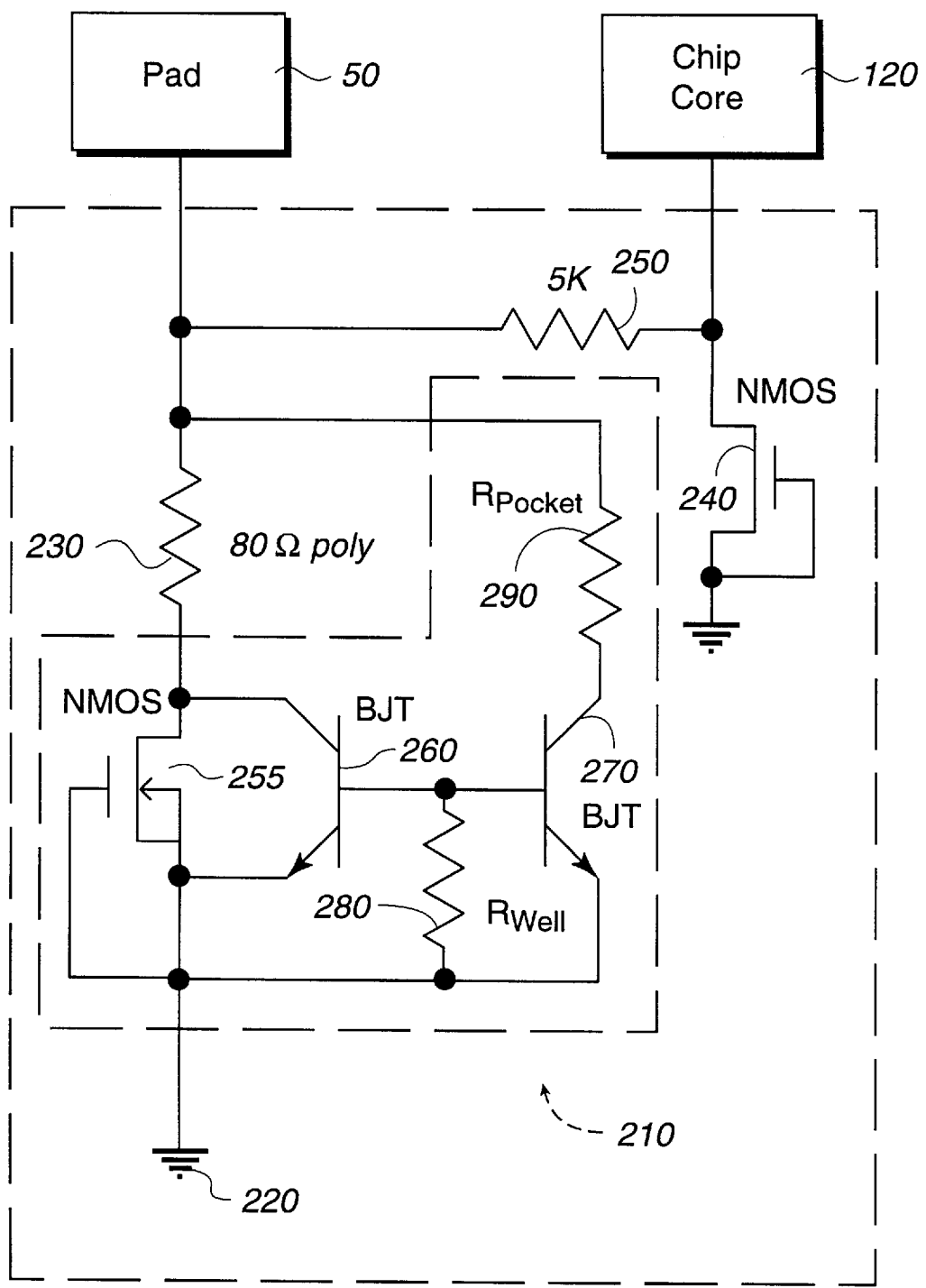
FIG. 5 is a schematic diagram of the ESD cell of FIG. 3 showing parasitic transistors.
Figure 7:
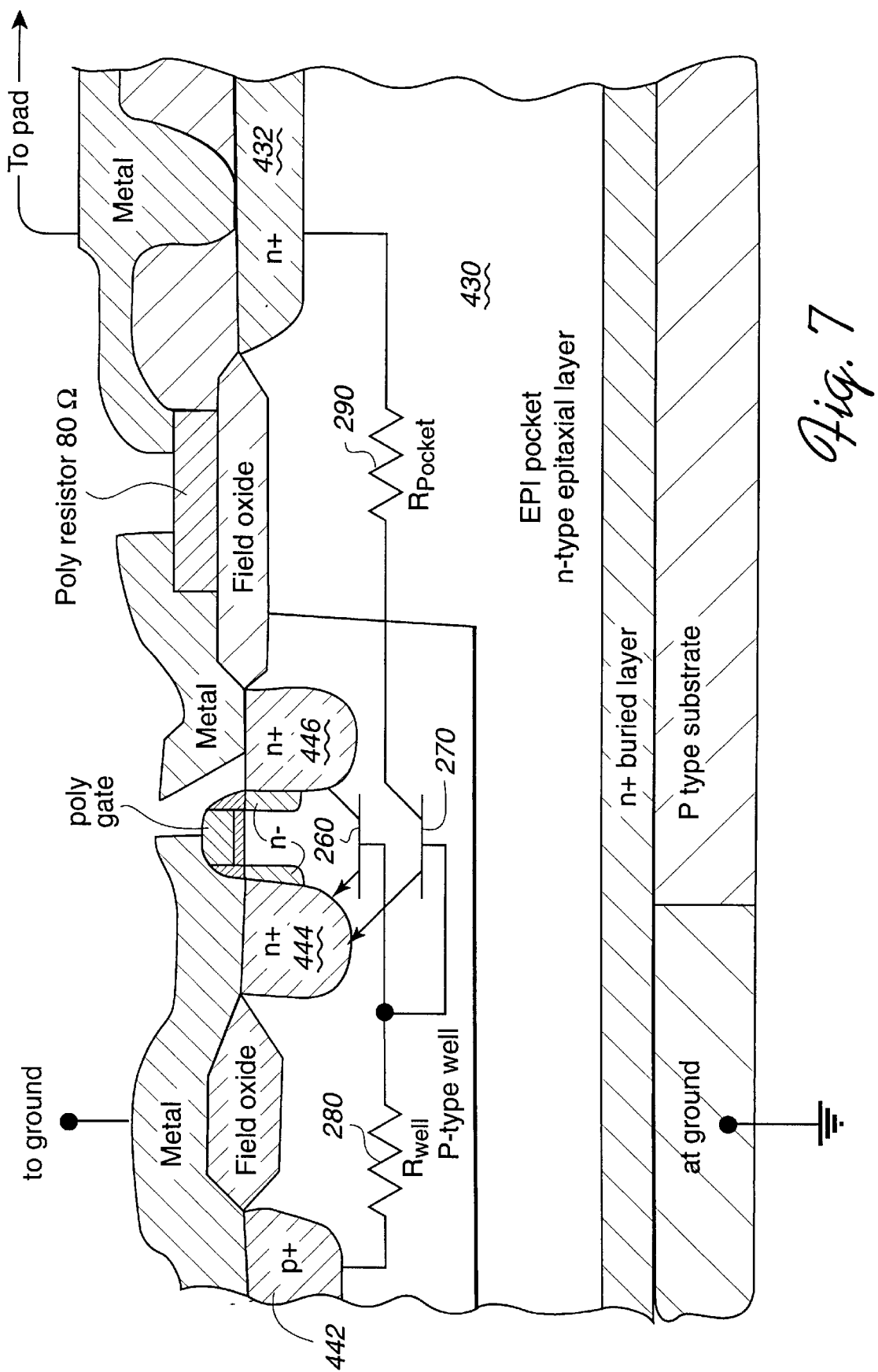
FIG. 7 is the ESD cell as shown in FIG. 6 with an equivalent circuit overlay used to describe its operation.

FIG. 5 illustrates ESD cell 200 from FIG. 3 where transistor 210 has been replaced with a schematic representation of an ideal transistor 255, parasitic bipolar junction transistors (BJT) 260 and 270, and resistors R(pocket) 290 and R(well) 280. A parasitic BJT is a transistor that is formed inherently in a process through adjoining n-type and p-type regions. Normally, the appearance of parasitic transistors is undesirable as they are not part of the planned design. As is known in the art, BJT 260 is present due to the particular process used, and will be described in greater detail in FIG. 7. Parasitic BJT 270 provides an advantageous increase in ESD protection for such an ESD cell. As shown in FIG. 7, a resistance R(well) 280 is present in the p-type well of the device, and a resistance R(pocket) 290 is present in the EPI pocket.

The cell of FIG. 5 functions as follows. When an electrostatic discharge is present at pad 50, BJT 260 is driven into avalanche (providing 0.5A of avalanche current), thus providing a base current for BJT 270, turning it on and providing a shunt path for current directly from the pad around resistor 230 and to ground 220. Such a shunt path is advantageous in that more current from an electrostatic discharge can then be routed to ground than is possible with only NMOS 210 and parasitic BJT 260. Parasitic BJT 270 appears due to the process technique shown in FIG. 6, and will provide superior ESD performance without causing any latch up of the device. Additionally, the cell sinks 5 to 6 amps of current typically in the positive voltage direction, and can sink a greater amount of current than for what it was designed.

In the embodiment of FIG. 4, the ESD cell has ten transistor-resistor legs. In this embodiment, in an ESD cell 200' as shown in FIG. 4, a parasitic BJT (such as BJT 260) would be present for each of the transistors 210 to 219, and a single parasitic BJT (such as BJT 270) would be present to shunt all of the polysilicon resistors 230 to 239.

Figure 6:
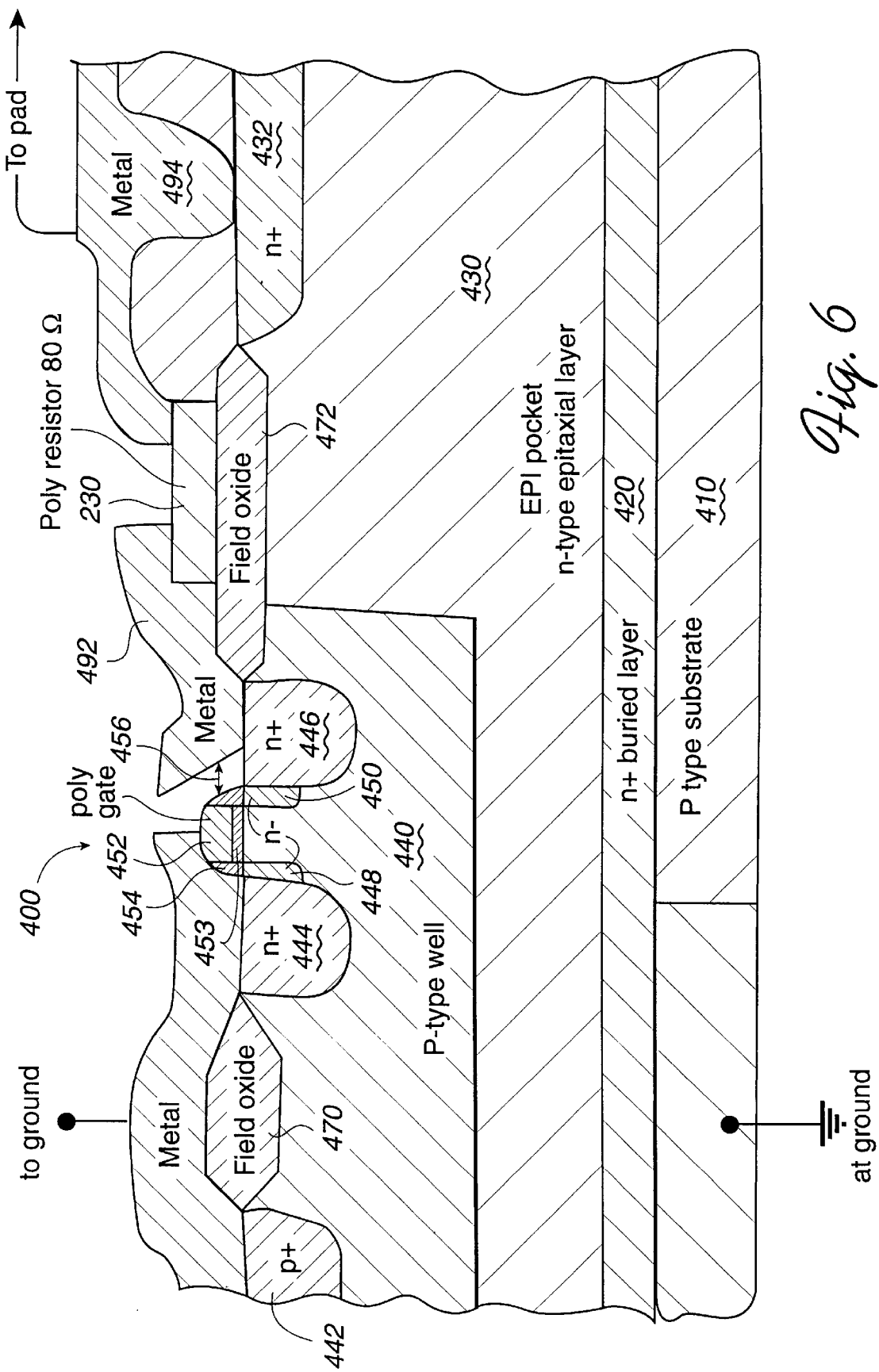
FIG. 6 illustrates an example cross-section of a process by which the ESD cell of FIG. 3 may be formed according to one embodiment of the present invention.

Embodiments of a circuit for an improved ESD cell having been described, examples of integrated circuit cross-sections for forming such circuits will now be described. FIG. 6 illustrates an integrated circuit cross-section 400 that forms an ESD cell 200 of the present invention as shown in FIG. 3. This particular cross-section uses a lightly-doped drain (LDD) technique for the formation of NMOS transistors. Although the present invention is suitable for a variety of processes, it works well with LDD devices having a very shallow LDD junction.

Cross-section 400 illustrates a grounded p-type substrate 410 above which is an n+ buried layer 420. Layer 420 is a low-resistance buried layer that has been shown to be beneficial for use with biCMOS technology. A wide variety of dopants may be used for n-type doping, with Arsenic working well with this process. Also, a wide variety of dopants may be used for p-type doping, with Boron working well with this process. The doping level of layer 420 may be in the range from $10^{17}$ to $10^{19}$ atoms/cm$^3$. Above layer 420 is a grown n-type epitaxial layer, or EPI pocket 430. The doping level in layer 430 may be in the range of $10^{14}$ to $10^{16}$ atoms/cm$^3$.

Diffused into EPI pocket 430 is a degeneratively doped n+ region 432 for providing a low-resistance contact to pad metal. Also diffused into EPI pocket 430 is a p-type well 440 for use in the formation of NMOS transistors. The doping level in p-type well 440 may be in the range of $10^{14}$ to $10^{17}$ atoms/cm$^3$ Diffused into p-type well 440 is a degeneratively doped p+ region 442 and degeneratively doped n+ regions 444 and 446 that form part of NMOS transistor 210. NMOS transistor 210 also includes lightly-doped regions 448 and 450. A wide variety of impurities may be used to dope regions 448 and 450 in order to provide a very shallow junction. By way of example, an Arsenic impurity in the range of $10^{13}$ to $5\times10^{13}$ atoms/cm$^3$ applied with an energy of about 80 keV works well for light doping in a high performance biCMOS process. Also included in NMOS transistor 210 is a polysilicon gate 452 having sidewall spacers 454 on top of a gate oxide 453. Distance 456 is the drain contact to gate distance that is typically increased in the prior art in order to attempt to achieve greater ESD performance. As will be appreciated by those of skill in the art, field oxide regions 470 and 472 provide separation.

Polysilicon resistor 230 is formed on top of field oxide 472 and is connected in series between a pad of the integrated circuit and NMOS transistor 210. Metallization 490 provides an electrical contact from the gate and source in NMOS transistor 210 and from p+ region 442 directly to ground. Metallization 492 provides electrical contact from drain 446 to one end of polysilicon resistor 230. Metallization 494 provides electrical contact from the other end of polysilicon resistor 230 to one pad of the integrated circuit and also to n+ region 432. By providing this additional metal contact directly from the pad of the integrated circuit to n+ region 432, the process provides for the formation of the second parasitic BJT 270, thus providing superior ESD performance for an ESD cell. Greater detail showing the parasitic transistors for this process will be described below with reference to FIG. 7.

Integrated circuit cross-section 400 of FIG. 6 may be implemented in a variety of manners. By way of example, in one embodiment NMOS transistor 210 has a width/length ratio of 50/3 lambda and connects to a 34/9 lambda polysilicon resistor having a value of 80 Ohms, where lambda is equivalent to 0.6 microns. Polysilicon gate 452 of NMOS transistor 210 may also be chamfered at the edges for a total of 1,000/3 lambda. This chamfering helps to mitigate the hot electron effects at the ends of the device.

FIG. 7 shows cross-section 400 of FIG. 6 with the addition of schematic representations of the two parasitic bipolar junction transistors shown in FIG. 5. BJT 260 parasitically forms between source 444, p-type well 440, and drain 446. BJT 270 parasitically forms between source 444, p-type well 440 and EPI pocket 430. Both bases of BJT 260 and BJT 270 encounter a resistance R(well) 280 in p-type well 440. A resistance R(pocket) 290 is also present in the EPI pocket 430. The operation of the parasitic transistors are as previously discussed with reference to FIG. 5.

Figure 8:
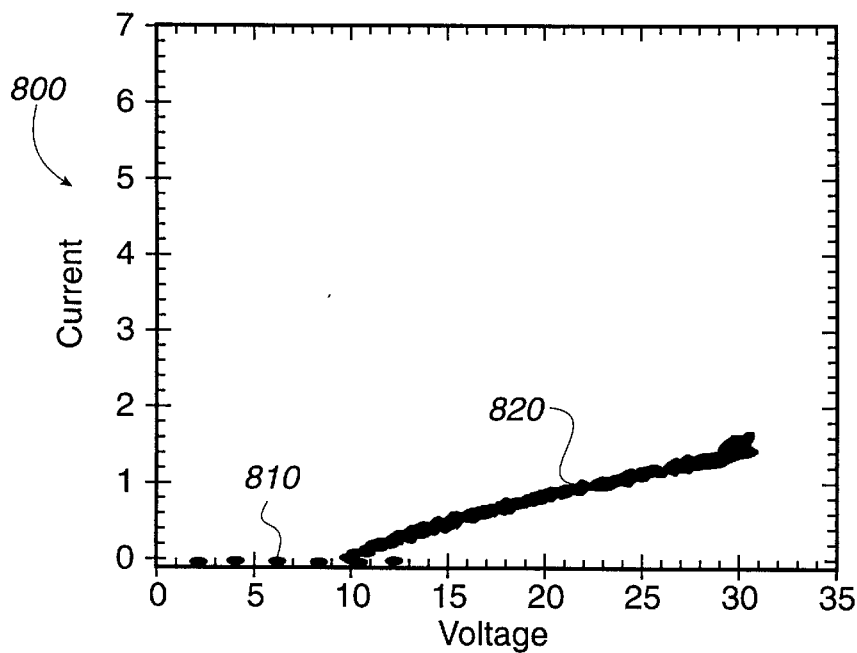
FIG. 8 is a graph showing current versus voltage characteristics for an ESD cell in which the pad metal is not connected to the pocket tap.

FIG. 8 is a graph 800 showing current versus voltage device characteristics for an NMOS transistor connected to a polysilicon resistor in which pad metal is not connected to an n+ pocket tap 432 of EPI pocket 430, i.e., it would operate in a fashion similar to that of the prior art. This graph shows the avalanche characteristic of the device 810 and a first snapback characteristic 820 of the parasitic bipolar junction transistor 260.

Figure 9:
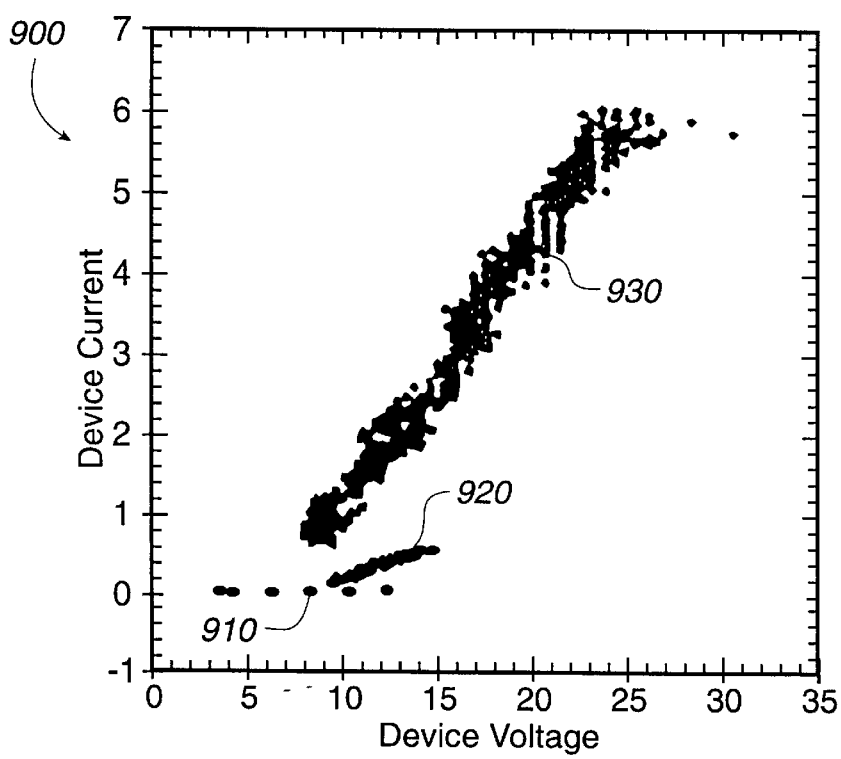
FIG. 9 is a graph showing current versus voltage characteristics for an embodiment of the present invention in which the pad metal is connected to the pocket tap.

FIG. 9, by contrast, shows a graph 900 illustrating current versus voltage characteristic for an NMOS transistor formed, for example, by a process shown in FIG. 6 in which pad metal is connected to n+ pocket tap 432. The avalanche characteristics of the device is shown at 910. A first snapback characteristic 920 is due to parasitic BJT 260, and a second snapback characteristic 930 is due of the formation of BJT 270. An analysis of the slope of characteristic 930 indicates that the resistance for this characteristic is less than the resistance of all polysilicon resistors in parallel (assuming more than one leg). This resistance anomaly confirms the presence of second parasitic BJT 270 which is shunting all of the polysilicon resistors. The higher device current passed is advantageous. Clearly, the device from FIG. 9 in which pad metal is connected directly to EPI pocket tap has superior ESD performance for higher voltages.

Although the foregoing invention has been described in some detail for purposes of clarity of understanding, it will be apparent that certain changes and modifications may be practiced within the scope of the appended claims. For instance, the ESD cell as described may be used in wide variety of integrated circuits. Such an ESD cell may be present in an I/O slot of a circuit, or located elsewhere. Also, such a cell may have one or more legs. Additionally, the superior ESD performance achieved may be applicable to a variety of process variations in which LDD techniques are used to improve drain performance. Therefore, the described embodiments should be taken as illustrative and not restrictive, and the invention should not be limited to the details given herein but should be defined by the following claims and their full scope of equivalents.

I claim:

1. An electrostatic discharge (ESD) cell formed in an integrated circuit comprising:

an n-type layer;

a p-type well formed in said n-type layer;

a connection pad;

an NMOS transistor formed in said p-type well with a lightly-doped drain (LDD), said NMOS transistor having a source, a drain and a gate, said source of said NMOS transistor electrically connected to ground, and said p-type well having a tap electrically connected to ground;

a resistor electrically connecting said drain of said NMOS transistor to said connection pad; and a conductor coupling said connection pad to said n-type layer.

2. An ESD cell as recited in claim 1 wherein said integrated circuit is formed using biCMOS technology and includes a semiconductor substrate of p-type, and wherein said integrated circuit includes an n+ buried layer formed above said semiconductor substrate and below said n-type layer.

3. An ESD cell as recited in claim 2 wherein said tap of said p-type well is a heavily doped p+ region.

4. An ESD cell as recited in claim 1 wherein said n-type layer is an epitaxial layer and includes an n+ doped pocket tap through which said n-type epitaxial layer is electrically connected to said connection pad of said integrated circuit.

5. An ESD cell as recited in claim 1 wherein said resistor is a polysilicon resistor having a resistance in the range of from about 40 Ohms to about 80 Ohms.

6. An ESD cell as recited in claim 5 wherein said polysilicon resistor has a resistance of about 79 Ohms.

7. An ESD cell as recited in claim 1 further including a plurality of said NMOS transistor and resistor pairs as recited in claim 1, each of said pairs connecting in parallel said connection pad to said ground.

8. An ESD cell as recited in claim 7 having ten NMOS transistor and resistor pairs.

9. An ESD cell as recited in claim 1 whereby when an electrostatic charge is applied to said connection pad, a parasitic bipolar junction transistor is formed between said connection pad and ground and improves ESD performance of said ESD cell by shunting current from said connection pad to ground around said resistor.

10. An ESD cell as recited in claim 1 wherein said lightly-doped drain (LDD) of said NMOS transistor is implanted with Arsenic in a concentration range of about $10^{13}$ to $5 \times 10^{13}$ atoms/cm$^3$ using an energy of about 80 keV.

11. An electrostatic discharge (ESD) cell formed in an integrated circuit using a bipolar-CMOS (biCMOS) process for use in preventing ESD damage to said integrated circuit, said ESD cell comprising:

an n-type layer;

a p-type well formed is said n-type layer;

a connection pad;

an NMOS transistor formed in said p-type well with a lightly-doped drain (LDD), said NMOS transistor having a source, a drain and a gate, said source of said NMOS transistor electrically connected to ground, and said p-type well having a tap electrically connected to ground;

a polysilicon resistor electrically connecting said drain of said NMOS transistor to said connection pad; and a conductor coupling said connection pad to a pocket tap of said n-type layer.

12. An ESD cell as recited in claim 11 wherein said integrated circuit includes a semiconductor substrate of p-type and an n+ buried layer formed above said semiconductor substrate and below said n-type layer.

13. An ESD cell as recited in claim 12 wherein said tap of said p-type well is a heavily doped p+ region.

14. An ESD cell as recited in claim 11 wherein said n-type layer is an epitaxial layer and wherein said pocket tap is an n+ doped pocket tap through which said n-type epitaxial layer is electrically connected to said connection pad of said integrated circuit.

15. An ESD cell as recited in claim 11 wherein said polysilicon resistor has a resistance in the range of from about 40 Ohms to about 80 Ohms.

16. An ESD cell as recited in claim 15 wherein said polysilicon resistor has a resistance of about 79 Ohms.

17. An ESD cell as recited in claim 11 further including a plurality of said NMOS transistor and resistor pairs as recited in claim 11, each of said pairs connecting in parallel said connection pad to said ground.

18. An ESD cell as recited in claim 17 having ten NMOS transistor and resistor pairs.

19. An ESD cell as recited in claim 11 whereby when an electrostatic charge is applied to said connection pad, a parasitic bipolar junction transistor is formed between said connection pad and ground and improves ESD performance of said ESD cell by shunting current from said connection pad to ground around said polysilicon resistor.

20. An ESD cell as recited in claim 11 wherein said lightly-doped drain (LDD) of said NMOS transistor is implanted with Arsenic in a concentration range of about $10^{13}$ to $5 \times 10^{13}$ atoms/cm$^3$ using an energy of about 80 keV.

\* \* \* \* \*